Dec. 17, 1968 J. C. FOSTER, JR 3,417,260

MONOLITHIC INTEGRATED DIODE-TRANSISTOR LOGIC CIRCUIT HAVING IMPROVED SWITCHING CHARACTERISTICS

Filed May 24, 1965

INVENTOR.
JOHN C. FOSTER Jr.
BY Mueller Aichele & Rauner
ATT'YS.

United States Patent Office 3,417,260

Patented Dec. 17, 1968

3,417,260

MONOLITHIC INTEGRATED DIODE-TRANSISTOR LOGIC CIRCUIT HAVING IMPROVED SWITCHING CHARACTERISTICS

John C. Foster, Jr., Scottsdale, Ariz., assignor to Motorola, Inc., Franklin Park, Ill., a corporation of Illinois Filed May 24, 1965, Ser. No. 457,976
5 Claims. (Cl. 307—213)

ABSTRACT OF THE DISCLOSURE

A monolithic integrated diode-transistor logic circuit including one or more offset diodes serially connected to the input of a transistor output device. The logic circuit further includes a speedup diode connected in parallel with the offset diode(s) and poled opposite to the offset diode(s) to thereby decrease the base discharge time of the transistor output device and increase the switching speed of the logic circuit.

This invention relates to an integrated semiconductor switching circuit and in particular to an improved circuit structure in which the turn-off time of the circuit is decreased.

In order to prevent noise from operating semiconductor switching circuits one or more diodes, called off-set diodes, are placed in series with the input circuit to the semiconductor switch. The off-set diodes are poled so that they are biased in a forward direction by the input signal. Since there is a forward voltage drop across each of the diodes used, the input signal must reach a predetermined amplitude before the semiconductor switch is operated. Thus noise or extraneous signals below this predetermined amplitude will not cause the switch to operate.

In high speed semiconductor switches, the turn-off time of the switch is limited by the speed with which the stored charges can be removed, from the semiconductor element being switched, after the control signal is removed. In semiconductor switches where a transistor is used as the switching element the charges are stored in the base region.

In circuits where off-set diodes are not used, the base charges are removed through the relatively low impedance input circuits. However, the off-set diodes are poled so as to be reverse biased by the base charges and thus they block the flow of the stored base charges through the low impedance input circuit. The base charges are thus removed through high impedance paths thereby increasing the turn-off time of the switch.

The turn-off time of discrete circuits has been improved by coupling a capacitor in parallel with the off-set diodes to provide a low impedance path for elimination of the stored base charges. Also the lifetimes of the stored charges in the off-set diodes can be made appreciably greater than the lifetime of the stored base charges in the semiconductor switches so that the diodes will not turn off before the semiconductor switch has turned off and the base charges can be removed through the off-set diodes.

However, in integrated circuit structures, capacitors are relatively difficult to fabricate and it is not desirable to use them in a circuit. Since the off-set diodes and transistors are fabricated at the same time and in the same material it is difficult to make the charge storage characteristics of the off-set diodes different from that of the transistor switch. For example, to improve the turn-off time of the semiconductor switching device, integrated circuit structures are subjected to a gold diffusion process which decreases the lifetime of the stored base charges. It is not presently possible to selectively gold diffuse an integrated circuit structure economically in production. Thus the lifetime of the stored charges in the off-set diodes is also decreased in the gold diffusion process and is of the same order of magnitude as that of the semiconductor switching element. When the input signal ceases the off-set diodes turn off very rapidly and prevent the removal of the stored base charges from the semiconductor switching element, except through high impedance paths.

It is therefore an object of this invention to provide a semiconductor switching circuit having off-set diodes for noise prevention and which has an improved turn-off time.

Another object of this invention is to provide a semiconductor switching circuit having an improved turn-off time and which is adapted to be formed in an integrated circuit structure.

Another object of this invention is to provide a semiconductor switching circuit having a circuit structure which provides a path for the removal of charges stored in the semiconductor switching element.

A feature of this invention is the provision of a semiconductor switching circuit including off-set diodes in which a speed-up diode is coupled in parallel with said off-set diodes and poled in a direction opposite to said off-set diodes.

Another feature of this invention is the provision of a semiconductor switching circuit in which the speed-up diode has a rectifying junction area of a magnitude whereby sufficient charges are stored therein to neutralize the charges stored in the semiconductor switching element.

The invention is illustrated in the drawings in which.

In practicing this invention, a semiconductor switching circuit is provided having off-set diodes coupling a control signal to the semiconductor switching element. When the control signal reaches a predetermined amplitude, as established by the off-set diodes, it causes conduction in the semiconductor switching element and charges are stored therein. A speed-up diode is coupled in parallel with the off-set diodes and poled in a direction opposite to that of the off-set diodes. The speed-up diode is reversed biased by the control signal and therefore does not couple the signal to the semiconductor switching device. The rectifying junction of the speed-up diode stores charges when the control signal is applied. The area of the rectifying junction is large enough so that the charges stored thereat are sufficient to neutralize the charges stored in the semiconductor switching element when the control signal is removed. Thus means are provided to rapidly remove the charges stored in the semiconductor switching element decreasing the turn-off time of the switch.

Figures 1, 2, 3:
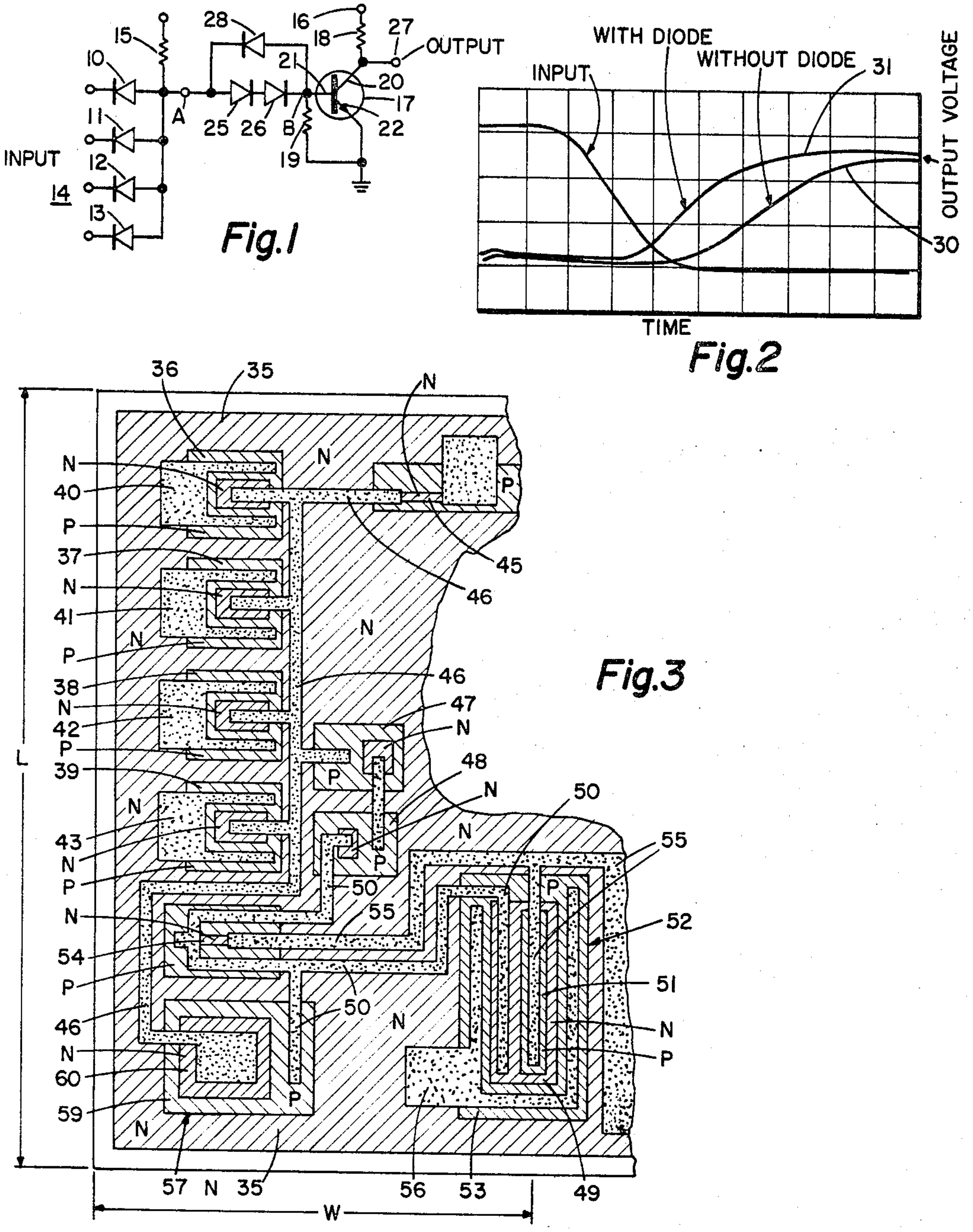
FIG. 1 is a schematic showing the circuit of this invention.
FIG. 2 is a graph illustrating the improvement in performance as a result of this invention.
FIG. 3 is a greatly enlarged plan view of an integrated circuit structure incorporating the circuit of this invention.

A schematic of the circuit of this invention is shown in FIG. 1. In this circuit a four-input OR gate 14, consisting of diodes 10 to 13 and resistor 15, is coupled, by off-set diodes 25 and 26, to base 21 of transistor 17, to control the flow of current through transistor 17. A resistor 18 couples collector 20 to power supply terminal 16. Resistor 19, coupled between base 21 and ground, is the input load resistance. Emitter 22 of transistor 17 is coupled to ground. Output terminal 27 is coupled to collector 20 of transistor 17.

In operation, when base 21 is biased positive, with respect to emitter 22, by an input control signal from OR gate 14, current flows from terminal 16 through resistor 18 and transistor 17. The current flow through resistor 18 causes the voltage at terminal 27 to decrease. When the signal from OR gate 14 is removed, conduction through transistor 17 stops and the voltage at output terminal 27 rises.

If input OR gate 14 were directly coupled to base 21 of transistor 17, noise signals present at the input to the logic circuit could be coupled to base 21 thus causing transistor 17 to conduct and produce an output signal. In order to prevent the generation of an output signal without a valid input signal, off-set diodes 25 and 26 are used to couple OR gate 14 to base 21 of transistor 17. Each of the off-set diodes 25 and 26 has an off-set voltage which must be exceeded by the signal from OR gate 14 in order to bias transistor 17 so that it will conduct. Placing off-set diodes 25 and 26 in series doubles the amplitude of the signal from OR gate 14 required to cause conduction in transistor 17. Noise signals which are below the sum of the off-set voltages of diodes 25 and 26, will not cause transistor 17 to conduct and thus will not develop an invalid output signal. While the circuit of this example uses two off-set diodes the invention is not thus limited and any number of off-set diodes required can be used.

The charges stored in base 21, when transistor 17 is conducting, must be removed before conduction will cease. If the carrier lifetime of off-set diodes 25 and 26 is of the same order of magnitude as that of the base region 21 of transistor 17, the charges stored in base region 21 cannot leave the base region through diodes 25 and 26. Thus, the charges stored in the base region 21 must be removed through resistor 19 which has a relatively high impedance. The result of this is that the turn-off time of transistor 17 is appreciably longer than the fall time of the control signal. In high-speed computer devices this increase in the fall time of the signals can materially slow the operation of the computer.

In order to improve the response of the transistor, speed-up diode 28 is coupled across off-set diodes 25 and 26, with its polarity reversed with respect to the polarity of the off-set diodes. When a control signal from OR gate 14 is applied across off-set diodes 25 and 26, speed-up diode 28 is reverse biased and charges are stored at the rectifying junction of the speed-up diode. These charges are of the opposite polarity to the charges stored in the base region 21 of transistor 17. Thus, when the control signal is removed, the stored base charges are neutralized by the charges stored in speed-up diode 28, and the turn-off time of transistor 17 is significantly decreased.

FIG. 2 illustrates the results of the incorporation of speed-up diode 28. Curve 30 illustrates the speed of turn-off of transistor 17 when speed-up diode 28 is not used. Curve 31 shows the decrease in turn-off time with speed-up diode 28 added to the circuit. As an example, it has been found that adding diode 28 to a circuit of this type will decrease the turn-off time from 32 nanoseconds to 22 nanoseconds.

In monolithic integrated circuits it has been found that certain processes, for example, gold diffusion, will decrease the carrier lifetime of the transistor, and thus this step is part of the process of forming the monolithic integrated circuit. However, it is difficult in production to selectively gold diffuse portions of the integrated circuit structure, therefore, off-set diodes 25 and 26 would also receive the gold diffusion and the carrier lifetimes of these diodes would be of the same order of magnitude as that of base region 21 of transistor 17. Thus off-set diodes 25 and 26 will increase the turn-off time of transistor 17 even though the transistor has been processed to decrease the turn-off time. Speed-up diode 28 is therefore coupled, with reversed polarity, across off-set diodes 25 and 26 to decrease the turn-off time of transistor 17. A diode is particularly adaptable to monolithic integrated circuit structure as it is more easily fabricated than other circuit elements, for example, a capacitor or a resistor.

FIG. 3 illustrates a portion of a monolithic integrated circuit structure incorporating the circuit of FIG. 1. This portion is shown greatly enlarged and as an example may have dimensions where W is approximately 25 mils and L is approximately 50 mils.

In this example the monolithic integrated circuit is formed in a substrate 35 of P type conductivity material. The input diodes of OR gate 14 of FIG. 1 are shown as regions 36 to 39 of FIG. 3. The structure of the diodes of the monolithic integrated circuit will be described in a subsequent portion of the specification. The input terminals to diodes 36 to 39 are shown as conducting portions 40 to 43. Resistor 15 of FIG. 1 is shown as resistance region 45 of FIG. 3. Resistance region 45 is connected to diodes 36 through 39 by conductor 46. Conductor 46 is also connected to diode region 47 which is connected in series with diode region 48. Diode regions 47 and 48 of FIG. 3 are the off-set diodes shown as diodes 25 and 26 of FIG. 1.

Off-set diode regions 47 and 48 of FIG. 3 are coupled to base 49 of transistor region 52 by conductor 50. Resistor 19 of FIG. 1 is shown as region 54 of FIG. 3 and is coupled between conductor 50 and a ground conductor 55. Speed-up diode 28 of FIG. 1 is shown as region 57 of FIG. 3, and is connected with reverse polarity across off-set diode regions 47 and 48 by conductors 46 and 50. Emitter region 51 is connected to ground conductor 55 and collector region 53 is connected to conductor 65.

Speed-up diode region 57 of FIG. 3 illustrates the form of a diode region in a monolithic integrated circuit. In this example the substrate region 35 is of P type conductivity material. Within the P type conductivity material a N type conductivity region 59 is formed. This region can be formed by masking and then by diffusion, alloying or epitaxial growth processes. Again by suitable masking and by diffusion, alloying or epitaxial growth processes, an P type conductivity region 60 is formed within the N type conductivity region 59. A layer of insulating material, shown as 58 in FIG. 4, covers the entire surface structure. The metallized conductors 46 and 50 are deposited on the insulating layer. Conductor 50 makes contact with N type conductivity region 59 through an opening formed in the insulating layer, and conductor 46 makes contact with P type conductivity region 60 through an opening formed in the insulating layer. The rectifying junction between N type conductivity layer 59 and P type conductivity layer 60 form a diode. Each of the diodes in the structure are formed in the same manner but may vary in size and shape dependent upon the requirements of the circuit. An isolation diffusion step is required to form the N type regions 76 and 78 surrounding diodes 25, 26 and 28 respectively, and this isolation diffusion forms PN junctions 72 and 74 which terminate at the P type substrate 35. The diffusion step required to form regions 76 and 78 and isolate the P type regions 47, 48 and 59 is well known in the art, and PN junctions 72 and 74 are reverse biased during operation of the integrated circuit to electrically isolate regions 47, 48 and 59 from the P type substrate 35.

Figure 4:
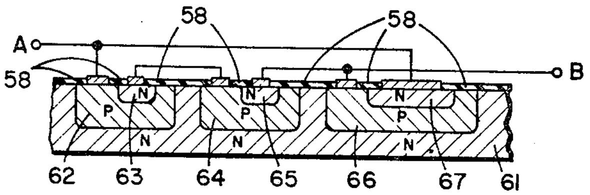
FIG. 4 is a greatly enlarged, side view, of a portion of a monolithic integrated circuit illustrating the form of the diodes used in FIG. 3.

FIG. 4 illustrates the side view of a portion of the structure of FIG. 3. The structure of FIG. 4 is not a cross section of any particular portion of FIG. 3, but is illustrative of the manner in which off-set diodes 47 and 48 and speed-up diode 57 of FIG. 3 are formed. A substrate 61 acts as an isolating medium for the diodes, and in this example, is formed of N type conductivity material. Regions of P type conductivity material of 62, 64 and 66, are formed in the N type conductivity substrate by masking and then by diffusion, alloying or epitaxial processes, and are isolated from each other by substrate 61. Each of the P type conductivity regions 62, 64 and 66, have N type conductivity regions 63, 65 and 67, respectively, formed therein by masking and by diffusion, alloying or epitaxial processes. The N type conductivity regions 63, 65 and 67, are isolated from the N type substrate by the P regions 62, 64 and 66. An insulating layer 58 covers the surface of the diode regions.

The regions of P type conductivity and N type conductivity separated by the isolating substrate 61 form diodes which are connected by metallized conductors, represented schematically in FIG. 4, through openings in insulating layer 58. These connections form the circuit for off-set diodes 25, 26 and speed-up diode 28 connected between points A and B of FIG. 1.

The junction area of speed-up diode 28, formed by the rectifying junction between P type conductivity region 66 and N type conductivity region 67, may be different from the junction areas of diodes 25 and 26 and in this example has a larger rectifying junction area than the diodes formed by P and N type conductivity regions 62, 63, 64 and 65. The diode formed by P and N type conductivity regions 66 and 67, is the speed-up diode 28 of FIG. 1 and the area of this rectifying junction of this diode is made sufficiently large so that enough charges will be stored in this diode, when it is reverse biased, to neutralize the charges stored in base 21 of transistor 17 while it is conducting. Speed-up diode 28 may be formed by more than one diode connected in parallel, if this structure is more suitable for circuit construction.

Thus a circuit structure has been shown to decrease the turn-off time of a transistor switching circuit. A reverse biased diode is coupled to the base of the transistor to supply charges to neutralize charges stored in the base region of the transistor. The diode structure used in this circuit is particularly adapted to monolithic integrated circuit construction.

I claim:

1. A monolithic integrated semiconductor circuit having input circuit means adapted to receive a control signal and transistor means including a base region, said monolithic integrated semiconductor circuit including in combination, first diode means coupling the input circuit means to the base region, said first diode means being poled in a predetermined direction and being responsive to the control signal above a predetermined amplitude to apply the same to the base region to cause conduction therethrough whereby charges are stored therein, second diode means having a rectifying junction of predetermined area coupled in parallel with said first diode means and poled in a direction opposite to said first diode means, said second diode means being responsive to the control signal to store charges at said rectifying junction therein, said predetermined rectifying junction area being of a magnitude whereby sufficient charges are stored therein to neutralize said charges stored in the base region in response to a reduction of the control signal below said predetermined amplitude, whereby conduction through said base region ceases.

2. A monolithic integrated circuit structure having input circuit means, adapted to receive a control signal, formed in a semiconductor substrate material of a first conductivity type, and a controlled semiconductor region, said monolithic integrated circuit structure including in combination, at least one first diode region formed in said semiconductor substrate, first conducting means coupling said first diode region between the input circuit means and the controlled semiconductor region, said first diode region being poled in a predetermined direction and being responsive to the control signal above a predetermined amplitude to apply the same to the controlled semiconductor region to cause conduction therethrough whereby charges are stored therein, at elast one rectifying junction formed in said semiconductor substrate, second conducting means coupling said rectifying junction in parallel with said first diode region, said rectifying junction being poled in a direction opposite to said first diode region and further being responsive to the control signal whereby charges are stored at said rectifying junction, the area of said rectifying junction being of a magnitude whereby sufficient charges are stored therein to neutralize said charges stored in the controlled semiconductor region in response to a reduction of the control signal below said predetermined amplitude whereby said conduction through said controlled semiconductor region ceases.

3. A monolithic integrated circuit structure having input circuit means, adapted to receive a control signal formed in a semiconductor substrate material of a first conductivity type, and transistor means having a base region, said monolithic integrated circuit structure including in combination, a plurality of first diode regions formed in said semiconductor substrate, first conducting means coupling said first diode regions in series between the input circuit means and the base region, said first diode regions being poled in a predetermined direction and being responsive to the control signal above a predetermined amplitude to apply the same to the base region to cause conduction therethrough whereby charges are stored therein, a rectifying junction formed in said semiconductor substrate, second conducting means coupling said rectifying junction in parallel with said series coupled first diode regions, said rectifying junction being poled in a direction opposite to said first diode regions and further being responsive to the control signal whereby charges are stored at said rectifying junction, the area of said rectifying junction being of a magnitude whereby sufficient charges are stored therein to neutralize said charges stored in the base region in response to a reduction of the control signal below said predetermined amplitude, whereby said conduction through said base region ceases.

4. A monolithic integrated circuit structure having input circuit means, adapted to receive a control signal, formed in a semiconductor substrate material of a first conductivity type, and transistor means including a base region, said monolithic integrated circuit structure including in combination, a plurality of first regions formed in the substrate, said first region being of a second conductivity type semiconductor material opposite said first conductivity type, a plurality of second regions of said first conductivity type semiconductor material, each of said first regions having one of said second regions formed therein forming a plurality of first diode regions, first conducting means coupling said first diode regions in series between the input circuit means and the base region, said first diode regions being poled in a predetermined direction and being responsive to the control signal above a predetermined amplitude to apply the same to the base region to cause conduction therethrough whereby charges are stored therein, a third region of said second conductivity type formed in said substrate and a fourth region of said first conductivity type formed in said third region and forming a rectifying junction therewith, second conducting means coupling said rectifying junction in parallel with said series coupled first diode regions, said rectifying junction being poled in a direction opposite to said first diode regions and further being responsive to the control signal whereby charges are stored at said rectifying junction, the area of said rectifying junction being of a magnitude whereby sufficient charges are stored therein to neutralize said charges stored in the base region in response to a reduction of the control signal below said predetermined amplitude, whereby said conduction through said base region ceases.

5. A monolithic integrated semiconductor circuit having input circuit means adapted to receive a control signal and transistor means including a base region, said semiconductor circuit including in combination, first and second off-set diode means series connected between the input circuit means and the base region, said first and second off-set diode means being poled in a predetermined direction and being responsive to the control signal above a predetermined amplitude to apply the same to the base region to cause conduction therethrough whereby charges are stored therein, speed-up diode means having a rectifying junction of predetermined area coupled in parallel with said first and second off-set diode means and poled in a direction opposite to said first and second off-set diode means, said speed-up diode means being responsive to the control signal to store charges at said rectifying junction therein, said predetermined rectifying junction area being of a magnitude whereby sufficient charges are stored therein to neutralize said charges stored in the base region in response to a reduction of the control signal below said predetermined amplitudes, whereby said conduction through said base region ceases.

References Cited

UNITED STATES PATENTS

| | | | |
|---|---|---|---|
| 3,039,009 | 6/1962 | Gray | 307—88.5 |
| 3,050,641 | 8/1962 | Walsh | 307—88.5 |
| 3,209,214 | 9/1965 | Murphy | 307—88.5 X |

ARTHUR GAUSS, *Primary Examiner.*

DONALD D. FORRER, *Assistant Examiner.*

U.S. Cl. X.R.

307—215, 319; 317—235